US010615102B2

(12) United States Patent
Takagi et al.

(10) Patent No.: US 10,615,102 B2
(45) Date of Patent: Apr. 7, 2020

(54) POWER SEMICONDUCTOR MODULE

(71) Applicant: Hitachi Automotive Systems, Ltd., Hitachinaka-shi, Ibaraki (JP)

(72) Inventors: Yusuke Takagi, Hitachinaka (JP); Takeshi Tokuyama, Tokyo (JP); Shun Kawano, Hitachinaka (JP); Takahiro Shimura, Hitachinaka (JP); Akira Matsushita, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 16/316,875

(22) PCT Filed: Jun. 30, 2017

(86) PCT No.: PCT/JP2017/024078
§ 371 (c)(1),
(2) Date: Jan. 10, 2019

(87) PCT Pub. No.: WO2018/020953
PCT Pub. Date: Feb. 1, 2018

(65) Prior Publication Data
US 2019/0295929 A1  Sep. 26, 2019

(30) Foreign Application Priority Data
Jul. 29, 2016  (JP) .................................. 2016-149181

(51) Int. Cl.
*H01L 23/495* (2006.01)
*H01L 23/50* (2006.01)
(Continued)

(52) U.S. Cl.
CPC .......... *H01L 23/4952* (2013.01); *H01L 23/48* (2013.01); *H01L 23/49541* (2013.01);
(Continued)

(58) Field of Classification Search
CPC . H01L 23/50; H01L 23/4952; H01L 2224/06; H01L 2224/05554;
(Continued)

(56) References Cited

U.S. PATENT DOCUMENTS

2005/0199987 A1  9/2005 Danno et al.
2013/0062724 A1  3/2013 Tokuyama et al.
(Continued)

FOREIGN PATENT DOCUMENTS

JP         56-110250 A    9/1981
JP      2009-278117 A   11/2009
(Continued)

OTHER PUBLICATIONS

International Search Report (PCT/ISA/210) issued in PCT Application No. PCT/JP2017/024078 dated Oct. 3, 2017 with English translation (four (4) pages).
(Continued)

*Primary Examiner* — Jasmine J Clark
(74) *Attorney, Agent, or Firm* — Crowell & Moring LLP

(57) ABSTRACT

The present invention is directed to improving the bonding strength between a bonding wire and a lead frame bonded to a plurality of semiconductor devices electrically connected in parallel. One end and the other end of a first bonding wire are connected to a control electrode and a first lead frame portion or a bent portion of a first semiconductor device, and one end and the other end of a second bonding wire are connected to a control electrode and a second lead frame portion of a second semiconductor device. The first lead frame portion extends in a direction overlapping with the first semiconductor device from the bent portion toward the side opposite to the first semiconductor device side, and the second lead frame portion extends from the bent portion
(Continued)

toward the second semiconductor device side in a direction overlapping with the second semiconductor device.

5 Claims, 4 Drawing Sheets

(51) Int. Cl.
    *H01L 23/00*         (2006.01)
    *H01L 25/07*         (2006.01)
    *H01L 25/18*         (2006.01)
    *H01L 23/48*         (2006.01)

(52) U.S. Cl.
    CPC ........ *H01L 23/49575* (2013.01); *H01L 23/50* (2013.01); *H01L 24/06* (2013.01); *H01L 24/33* (2013.01); *H01L 24/49* (2013.01); *H01L 25/07* (2013.01); *H01L 25/18* (2013.01); *H01L 2224/05554* (2013.01); *H01L 2224/06* (2013.01); *H01L 2224/49113* (2013.01)

(58) Field of Classification Search
    CPC ........... H01L 2224/49113; H01L 25/07; H01L 24/49; H01L 24/33; H01L 24/06; H01L 23/49541

USPC ... 257/666–677, E23.004, E23.031–E23.059
See application file for complete search history.

(56) References Cited

U.S. PATENT DOCUMENTS

| | | | |
|---|---|---|---|
| 2013/0155745 A1* | 6/2013 | Tanaka | H02M 7/003 363/131 |
| 2015/0162274 A1* | 6/2015 | Kadoguchi | H01L 23/047 257/694 |
| 2015/0371921 A1 | 12/2015 | Tanaka | |

FOREIGN PATENT DOCUMENTS

| | | |
|---|---|---|
| JP | 2010-103436 A | 5/2010 |
| JP | 2011-216755 A | 10/2011 |
| JP | 2016-46279 A | 4/2016 |
| WO | WO 2014/122908 A1 | 8/2014 |

OTHER PUBLICATIONS

Japanese-language Written Opinion (PCT/ISA/237) issued in PCT Application No. PCT/JP2017/024078 dated Oct. 3, 2017 (three (3) pages).

* cited by examiner

POWER SEMICONDUCTOR MODULE

TECHNICAL FIELD

The present invention relates to a power semiconductor module.

BACKGROUND ART

The power semiconductor module includes, for example, a power semiconductor device such as an insulated gate bipolar transistor (hereinafter referred to as IGBT) constituting an inverter circuit or the like. A power semiconductor device is bonded to a metal plate by a bonding material such as solder and mounted so as to be capable of releasing heat generated therein. A control electrode of the power semiconductor device is connected to a control lead frame by a bonding wire and connected to an external device such as a control circuit.

A plurality of power semiconductor devices is electrically connected in parallel, such that a large output can be achieved.

To bond the bonding wire to the lead frame, radio frequency vibration is applied in a state where the bonding wire is pressed against the lead frame, and vibration energy is applied to the bonding wire to bond by frictional heat generated between the bonding wire and the lead frame.

A control lead frame for electrically connecting a plurality of power semiconductor devices in parallel has, for example, a structure having a branch frame portion extending from one lead body in a direction perpendicular to the lead body. Then, the lead body and the branch lead frame portion are bonded to each of the power semiconductor devices by the bonding wires (refer to, for example, FIG. 9 in PTL 1).

CITATION LIST

Patent Literature

PTL 1: JP 2011-216755 A

SUMMARY OF INVENTION

Technical Problem

In the structure of PTL 1, to perform bonding wire bonding to a branch lead frame portion of a lead frame, the end portion of the bonding wire is disposed on the distal end side of the branch lead frame portion. Then, the end portion of the bonding wire is vibrated in a direction in which the power semiconductor device is disposed, in other words, in a direction perpendicular to a direction in which the branch lead frame portion extends. The direction perpendicular to the direction in which the branch lead frame portion extends is a direction perpendicular to the longitudinal direction of the branch lead frame portion. However, since the rigidity of the branch lead frame portion in this direction is small, the branch lead frame portion tends to vibrate together with radio frequency vibration given at the time of bonding. Therefore, large vibration energy cannot be given to the bonding wire and the branch lead frame portion, and sufficient bonding strength cannot be obtained for bonding between the bonding wire and the branch lead frame portion.

Solution to Problem

In an aspect of the present invention, a power semiconductor module includes a first semiconductor device, a second semiconductor device electrically connected in parallel to the first semiconductor device, and a control lead frame connected to a control electrode of the first semiconductor device via a first bonding wire and connected to a control electrode of the second semiconductor device via a second bonding wire. The control lead frame includes a first lead frame portion, a bent portion, and a second lead frame portion connected to the first lead frame portion via the bent portion. One end of the first bonding wire is connected to the control electrode of the first semiconductor device, and the other end of the first bonding wire is connected to the first lead frame portion or the bent part. One end of the second bonding wire is connected to the control electrode of the second semiconductor device, and the other end of the second bonding wire is connected to the second lead frame portion. The first lead frame portion extends in a direction overlapping with the first semiconductor device from the bent portion toward a side opposite to the first semiconductor device side. The second lead frame portion extends in a direction overlapping with the second semiconductor device from the bent portion toward the second semiconductor device side.

Advantageous Effects of Invention

According to the present invention, it is possible to improve the bonding strength between a bonding wire and a lead frame.

DESCRIPTION OF EMBODIMENTS

An embodiment of the power semiconductor module of the present invention will be described below with reference to the drawings.

A power semiconductor module containing a power conversion circuit such as an inverter circuit is mounted in a vehicle such as an electric vehicle, a hybrid vehicle (HEV), or a plug-in hybrid vehicle (PHV). A three-phase inverter can be constituted by parallelly connecting power semiconductor modules incorporating inverter circuits. The inverter circuit is connected to a battery, and a motor generator is operated as a motor. Further, the motor generator can be operated by the power of an engine, and the battery can be charged via the inverter circuit.

In the following, a power semiconductor module incorporating the inverter circuit will be described as an embodiment.

Figure 1:
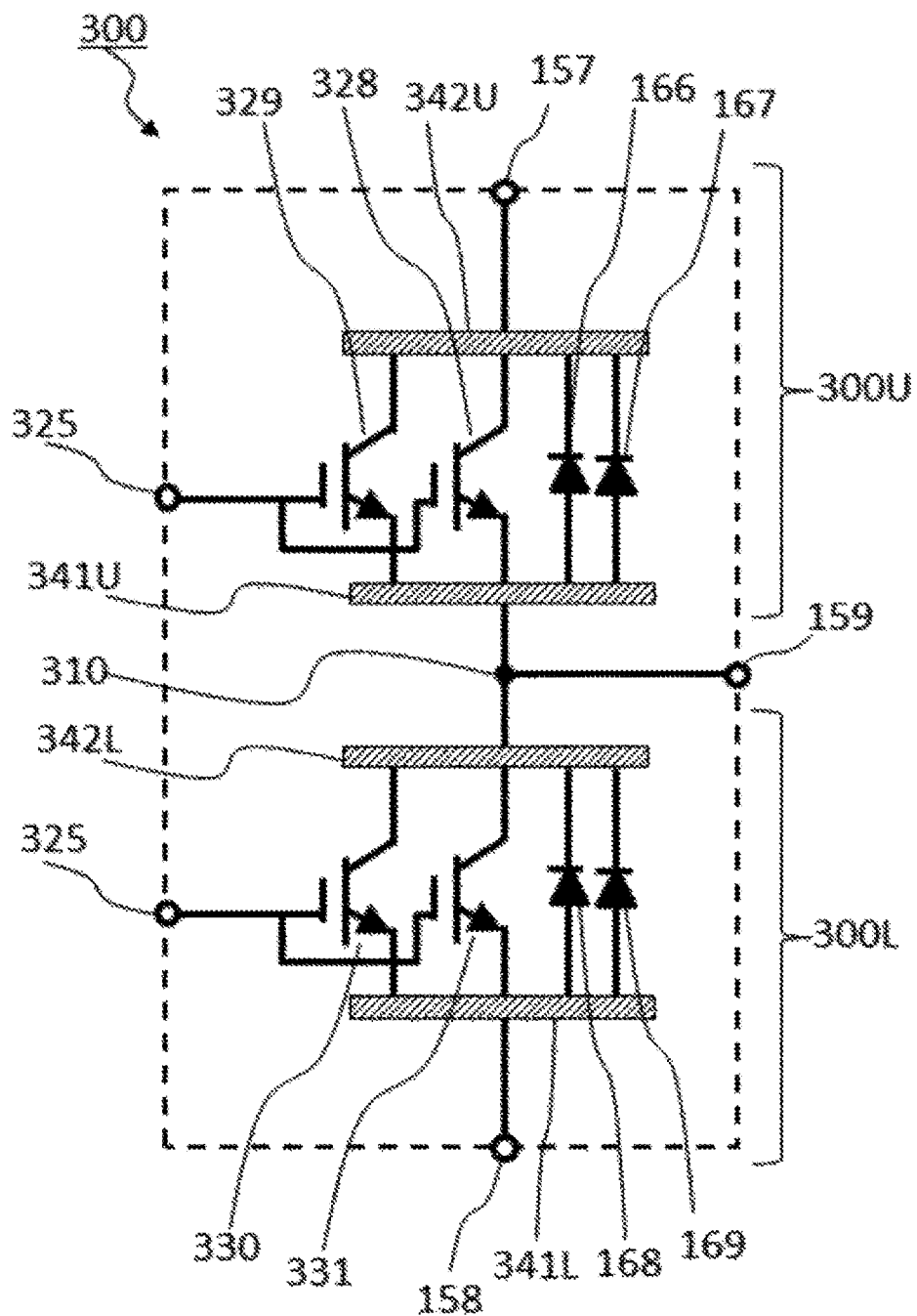
FIG. 1 is a schematic diagram of an example of a circuit incorporated in a power semiconductor module of the present invention.

FIG. 1 is a schematic diagram of an example of the circuit incorporated in the power semiconductor module of the present invention.

As described above, a power semiconductor module 300 incorporates an inverter circuit for mutually converting DC power and AC power. The power semiconductor module 300 includes a first circuit body 300U constituting an upper arm of the inverter circuit and a second circuit body 300L constituting a lower arm. The power semiconductor module 300 includes an AC terminal 159 that inputs and outputs AC power. The AC terminal 159 inputs and outputs one of three phases of U phase, V phase, and W phase to a motor generator.

Further, the power semiconductor module 300 includes a DC positive electrode terminal 157 and a DC negative electrode terminal 158. The DC positive electrode terminal 157 and the DC negative electrode terminal 158 are respectively connected to a battery and a capacitor (not illustrated) to input and output DC power. Further, the power semiconductor module 300 includes a power semiconductor device as a switching element for converting the supplied DC power into AC power.

The power semiconductor module 300 is provided with a control lead frame 325 that receives a control signal from a driver circuit (not illustrated). The power semiconductor device receives a control signal from the control lead frame 325, performs a conduction or cutoff operation, and converts the supplied DC power into AC power.

The power semiconductor device includes first semiconductor devices 328 and 330, second semiconductor devices 329 and 331, third semiconductor devices 166 and 168, and fourth semiconductor devices 167 and 169. The first semiconductor devices 328 and 330 and the second semiconductor devices 329 and 331 are, for example, gate insulated bipolar transistors (IGBTs). Instead of the IGBT, a metal oxide semiconductor field effect transistor (MOSFET) may be used.

The third semiconductor devices 166 and 168 and the fourth semiconductor devices 167 and 169 are, for example, diodes.

The first semiconductor device 328 and the second semiconductor device 329, the third semiconductor device 166, and the fourth semiconductor device 167 are connected to a first conductor unit 342U and a second conductor unit 341U. Specifically, the first semiconductor unit 342U is connected to collector electrodes of the first semiconductor device 328 and the second semiconductor device 329 and also connected to cathode electrodes of the third semiconductor device 166 and the fourth semiconductor device 167. The second conductor unit 341U is connected to emitter electrodes of the first semiconductor device 328 and the second semiconductor device 329 and also connected to anode electrodes of the third semiconductor device 166 and the fourth semiconductor device 167.

The first semiconductor device 328, the second semiconductor device 329, the third semiconductor device 166, and the fourth semiconductor device 167 constitute the first circuit body 300U of an inverter circuit.

Similarly, the first semiconductor device 330, the second semiconductor device 331, the third semiconductor device 168, and the fourth semiconductor device 169 are connected to a third conductor unit 342L and a fourth conductor unit 341L. Specifically, the third conductor unit 342L is connected to collector electrodes of the first semiconductor device 330 and the second semiconductor device 331 and also connected to cathode electrodes of the third semiconductor device 168 and the fourth semiconductor device 169. The fourth conductor unit 341L is connected to emitter electrodes of the first semiconductor device 330 and the second semiconductor device 331 and connected to anode electrodes of the third semiconductor device 168 and the fourth semiconductor device 169.

The first semiconductor device 330, the second semiconductor device 331, the third semiconductor device 168, and the fourth semiconductor device 169 constitute the second circuit body 300L of the inverter circuit.

The first conductor unit 342U is connected to the DC positive electrode terminal 157, and the second conductor unit 341U is connected to an intermediate connecting portion 310.

The fourth conductor unit 341L is connected to the DC negative electrode terminal 158, and the third conductor unit 342L is connected to the intermediate connecting portion 310. The second conductor unit 341U and the third conductor unit 342L are connected to the intermediate connecting portion 310. The intermediate connecting portion 310 is connected to the AC terminal 159.

Figure 2:
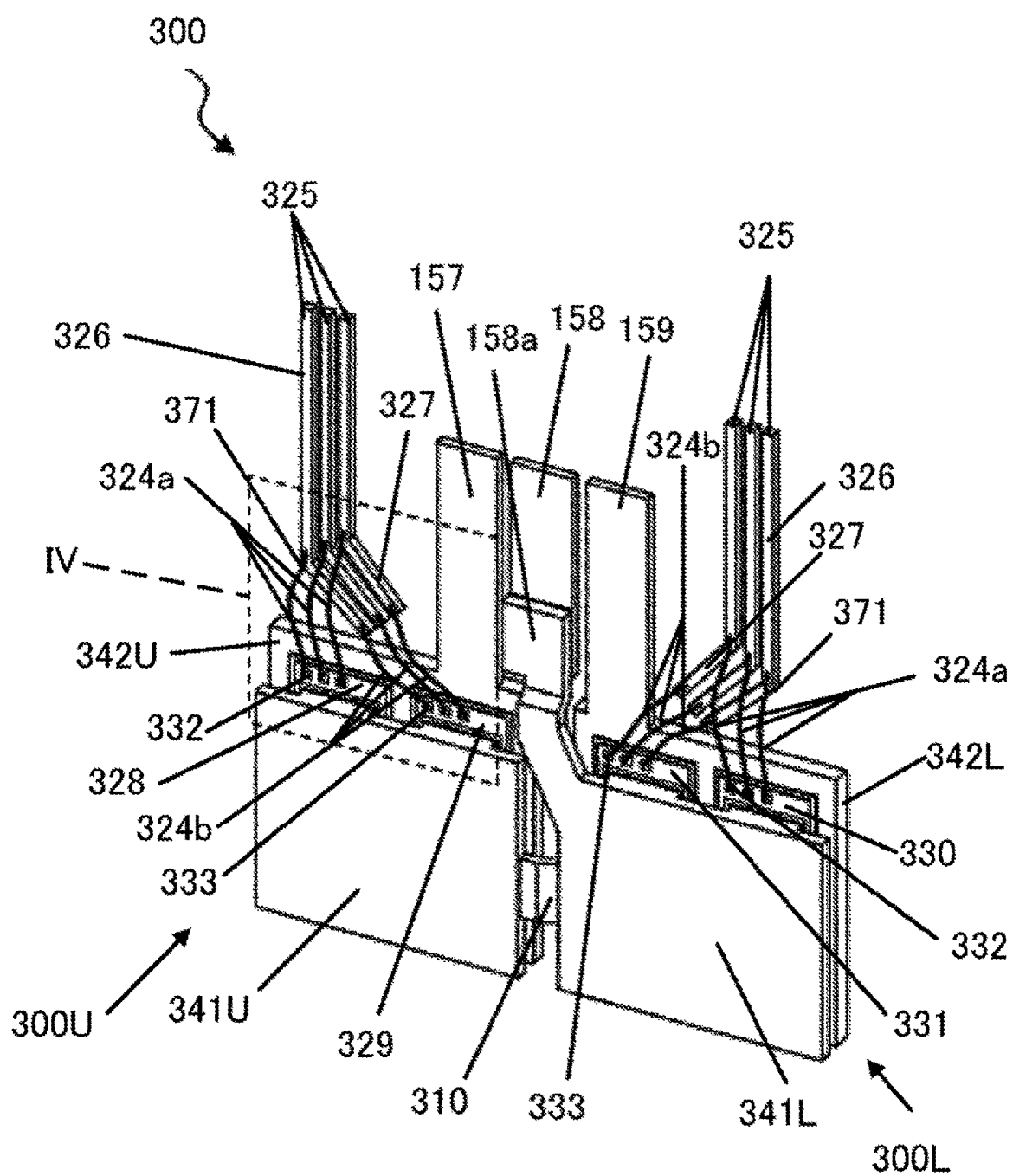
FIG. 2 is a perspective view of an embodiment of the power semiconductor module of the present invention.
Figure 3:
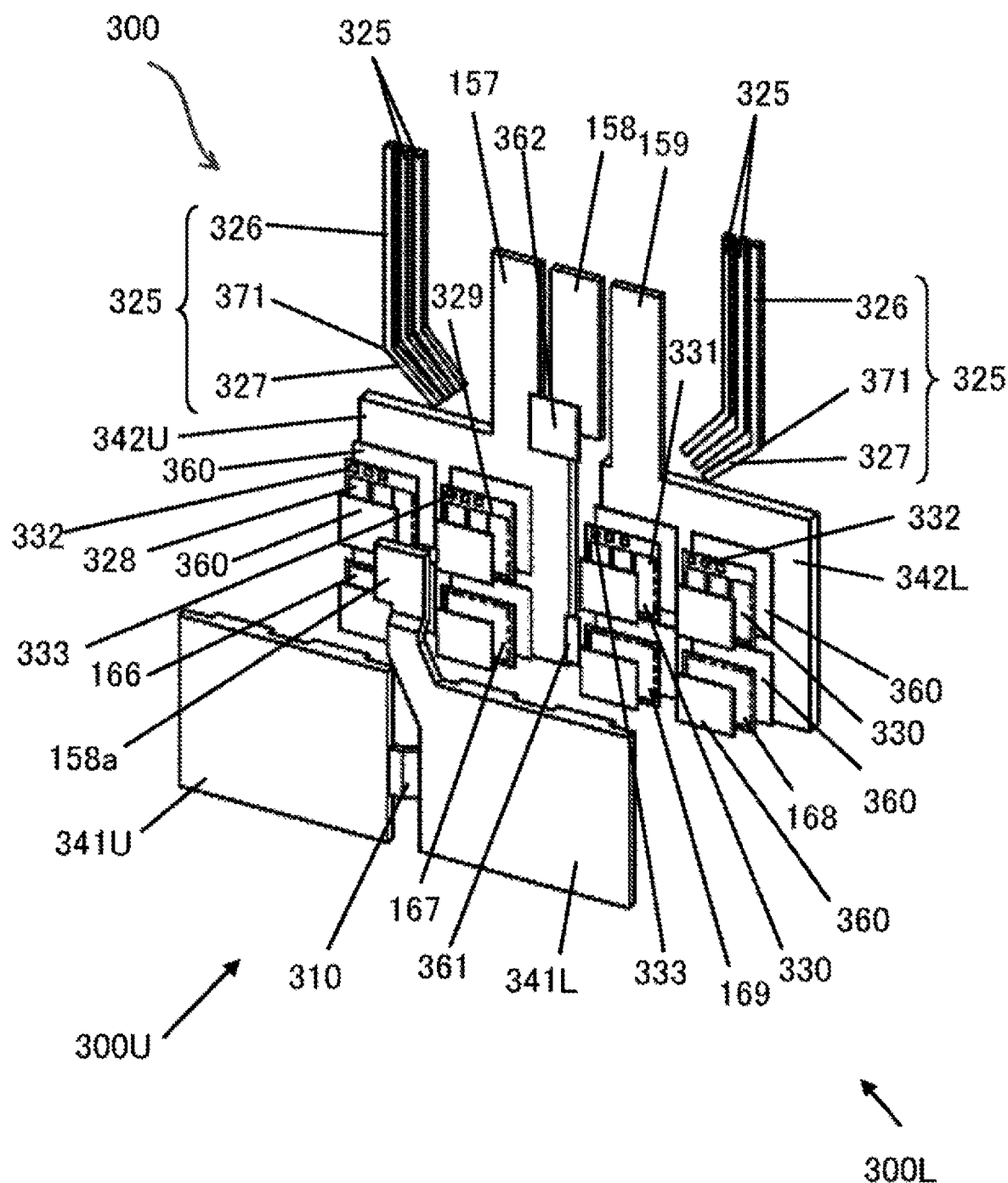
FIG. 3 is an exploded perspective view of the power semiconductor module illustrated in FIG. 2.

FIG. 2 is a perspective view of an embodiment of the power semiconductor module according to the present invention. FIG. 3 is an exploded perspective view of the power semiconductor module illustrated in FIG. 2.

Each member name and its reference number described in FIG. 1 are denoted by the same member name and reference number also in FIGS. 2 and 3.

The first circuit body 300U and the second circuit body 300L constituting the power semiconductor module 300 are arranged adjacent to each other. The first circuit body 300U has a structure in which the first and second semiconductor devices 328 and 329 and the third and fourth semiconductor devices 166 and 167 are sandwiched between the first conductor unit 342U and the second conductor unit 341U which are disposed to face each other, and the first circuit body 300U has a substantially thin plate-like rectangular parallelepiped shape. Each of the first semiconductor device 328 and the second semiconductor device 329 is a plate-shaped semiconductor substrate and is disposed adjacent to and spaced apart from each other. In addition, the third semiconductor device 166 and the fourth semiconductor device 167 are plate-shaped semiconductor substrates and are disposed adjacent to and spaced part from each other.

Similarly, the second circuit body 300L has a structure in which the first and second semiconductor devices 330 and 331 and the third and fourth semiconductor devices 168 and 169 are sandwiched between the third conductor unit 342L and the fourth conductor unit 341L which are disposed to face each other and is formed in a substantially thin plate-like rectangular parallelepiped shape. Each of the first semiconductor device 330 and the second semiconductor device 331 of the second circuit body 300L is a plate-shaped semiconductor substrate member, like the first and second semiconductor devices 328 and 329 of the first circuit body 300U and are disposed adjacent to and spaced apart from each other. Similarly to the third and fourth semiconductor devices 166 and 167 of the first circuit body, the third semiconductor device 168 and the fourth semiconductor device 169 of the second circuit body are plate-shaped semiconductor substrate members and are disposed adjacent to and spaced apart from each other.

The first circuit body 300U and the second circuit body 300L are disposed such that the first conductor unit 342U and the third conductor unit 342L are disposed on the same plane, and the second conductor unit 341U and the fourth conductor unit 341L are disposed on the same plane. As illustrated in FIG. 2, the first semiconductor device 328 and the second semiconductor device 329 of the first circuit body 300U are connected to a plurality of the control lead frames 325 via first bonding wires 324$a$ or second bonding wires 324$b$. Similarly, the first semiconductor device 330 and the second semiconductor device 331 of the second circuit body 300L are connected to a plurality of the control lead frames 325 via the first bonding wires 324a or the second bonding wires 324b.

The DC positive electrode terminal 157 is integrally molded to the first conductor unit 342U by sheet metal processing or the like.

A plate-shaped DC negative electrode terminal 158 is disposed above the boundary between the first conductor unit 342U and the third conductor unit 342L. The DC negative electrode connecting portion 158a is integrally molded to the fourth conductor unit 341L by sheet metal processing or the like. The DC negative electrode connecting portion 158a extends to a position facing the DC negative electrode terminal 158 and is bonded to the DC negative electrode terminal 158 by a bonding material 362 (refer to FIG. 3) such as solder. An external device (not illustrated), such as a DC power supply, is connected to the DC positive electrode terminal 157 and the DC negative electrode terminal 158, and electric power is supplied.

The AC terminal 159 is integrally molded to the third conductor unit 342L by sheet metal processing or the like. The AC terminal 159 is an AC input/output unit connected to an external device such as an electric motor or an electric generator.

The intermediate connecting portion 310 is integrally molded to the second conductor unit 341U by sheet metal working or the like. The intermediate connecting portion 310 extends to the second circuit body 300L side and is joined to the inner surface of the third conductor unit 342L by a bonding material 361 (refer to FIG. 3) such as solder.

Each of the first semiconductor device 328 and the second semiconductor device 329 has a plurality of control electrodes 332 and 333 formed on one surface. One surface side of each of the first semiconductor device 328 and the second semiconductor device 329 is bonded to the second conductor unit 341U via a bonding material 360 such as solder with the control electrodes 332 and 333 exposed. The other surface side of each of the first semiconductor device 328 and the second semiconductor device 329 is bonded to the first conductor unit 342U via the bonding material 360 such as solder. An anode electrode is provided on one surface side of the third and fourth semiconductor devices 166 and 167, and each of the anode electrodes is bonded to the second conductor unit 341U via the bonding material 360 such as solder. Cathode electrodes are provided on the other surface side of the third and fourth semiconductor devices 166 and 167, and each of the cathode electrodes is bonded to the first conductor unit 342U via the bonding material 360 such as solder.

Similarly, each of the first semiconductor device 330 and the second semiconductor device 331 has a plurality of the control electrodes 332 and 333 on one side. One surface side of each of the first semiconductor device 330 and the second semiconductor device 331 is bonded to the fourth conductor unit 341L via the bonding material 360 such as solder with the control electrode terminals 332 and 333 exposed. The other surface side of each of the first semiconductor device 330 and the second semiconductor device 331 is bonded to the third conductor unit 342L via the bonding material 360 such as solder. An anode electrode is provided on one surface side of the third and fourth semiconductor devices 168 and 169, and each of the anode electrodes is bonded to the fourth conductor unit 341L via the bonding material 360 such as solder. A cathode electrode is provided on the other surface side of the third and fourth semiconductor devices 168 and 169, and each of the cathode electrodes is bonded to the third conductor unit 342L via the bonding material 360 such as solder.

The first circuit body 300U and the second circuit body 300L are mounted as described above and form the inverter circuit illustrated in FIG. 1.

Figure 4:
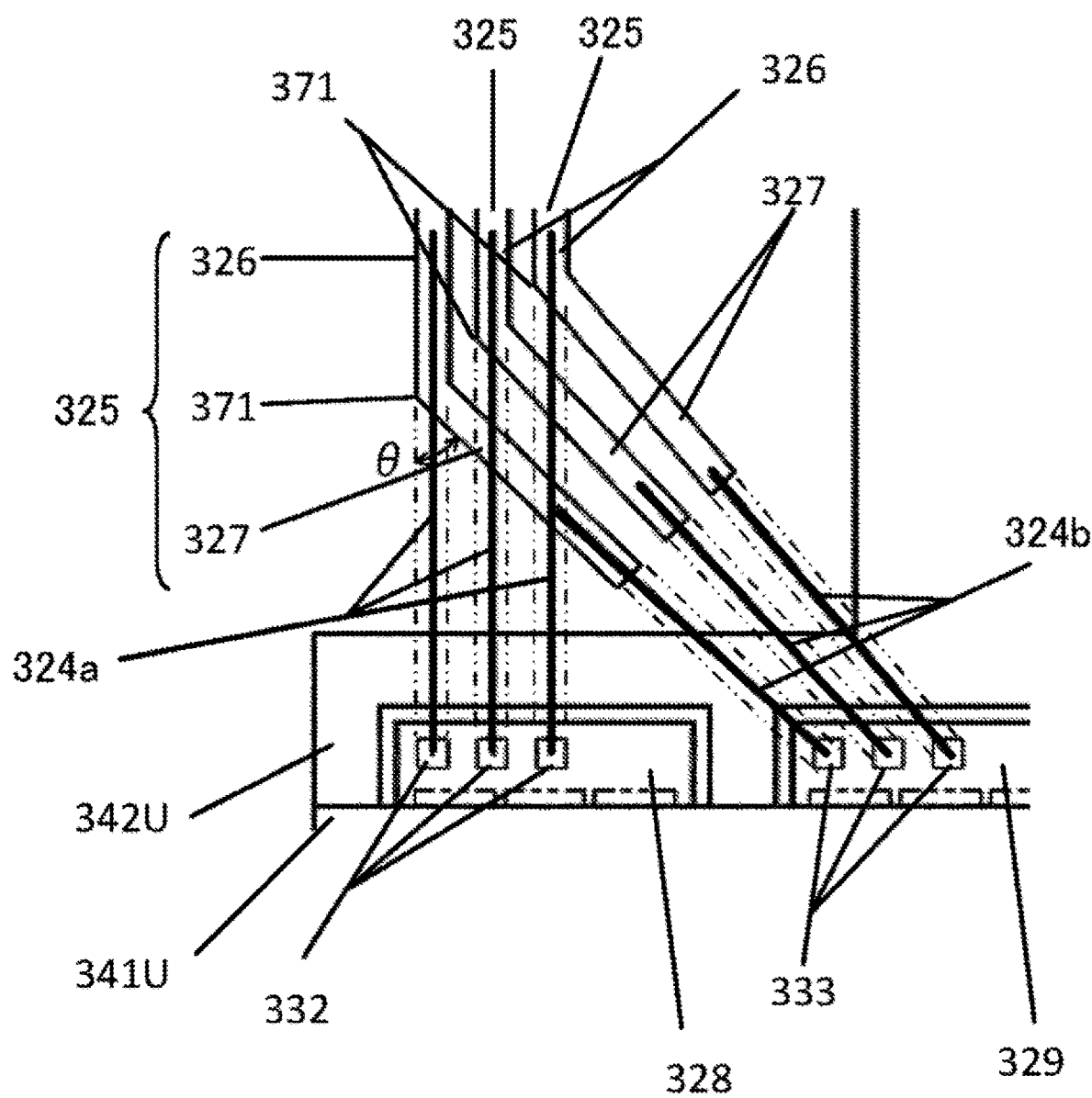
FIG. 4 is an enlarged view of the region IV illustrated in FIG. 2.

FIG. 4 is an enlarged view of the region IV in FIG. 2.

As described above, a plurality of the control lead frames 325 is connected to the first and second semiconductor devices 330 and 331 of the first circuit body 300U via the first and second bonding wires 324a and 324b. In addition, a plurality of the control lead frames 325 is connected to the first and second semiconductor devices 328 and 329 of the second circuit body 300L via the first and second bonding wires 324a and 324b. Hereinafter, the connection structure (upper arm connection structure) between the control lead frame 325 and the first and second semiconductor devices 328 and 329, and the connection structure (lower arm connection structure) between the control lead frame 325 and the first and second semiconductor devices 330 and 331 will be described.

However, since the upper arm connecting structure and the upper arm connecting structure are substantially the same, the upper arm connecting structure will be described below.

The control lead frame 325 is formed by sheet metal processing or the like and has a first lead frame portion 326, a second lead frame portion 327, and a bent portion 371.

The second lead frame portion 327 is bent at the bent portion 371 with respect to the first lead frame portion 326 at a bending angle θ smaller than 90 degrees.

Each of the first and second semiconductor devices 328 and 329 has a plurality of the control electrodes 332 and 333. The control electrodes 332 and 333 include a gate electrode, a Kelvin emitter electrode, a temperature sensor electrode, and the like. From the Kelvin emitter electrode, the reference potential of a gate signal is transmitted to a drive circuit (not illustrated). A temperature sensor electrode is connected to a temperature sensor (not illustrated) formed in the first semiconductor device 328 or the second semiconductor device 329, and the temperature of the first semiconductor device 328 or the second semiconductor device 329 is transmitted to a control circuit (not illustrated) from the temperature sensor electrode.

Note that emitter electrodes are formed on substantially the entire region of one surface of the first and second semiconductor devices 328 and 329 except for the control electrodes 332 and 333, and collector electrodes are formed on substantially the entire surface of the other surface side of the first and second semiconductor devices 328 and 329.

In the present embodiment, three control electrodes 332 and 333 are provided to the first and second semiconductor device 328 and 329, respectively, and three control lead frames 325 are also disposed. The first lead frame portion 326 of each control lead frame 325 is disposed substantially perpendicular to the arrangement direction of the control electrodes 332 and 333. The widths (the length in the left-right direction) of the first and second lead frame portions 326 and 327 are substantially the same as the widths of the control electrodes 332 and 333. However, if a predetermined gap is provided between the first lead frame portions 326 or between the second lead frame portions 327, the widths of the first and second lead frame portions 326 and 327 may be smaller or larger than the widths of the control electrodes 332 and 333. The width of the first lead frame portion 326 and the width of the second lead frame portion 327 may be different from each other, and the width of the first lead frame portion 326 or the width of the second lead frame portions 327 may be different from each other.

The first lead frame portion 326 extends from the bent portion 371 to the side opposite to the first semiconductor device 328, and the second lead frame portion 327 extends from the bent portion 371 toward the first semiconductor device 328 side.

The center line in the width direction of each first lead frame portion 326 passes through the center in the width direction of the corresponding control electrode 332. The center line in the width direction of each second lead frame portion 327 passes through the center in the width direction of the corresponding control electrode 333. Since the second lead frame portion 327 is bent with respect to the first lead frame 326, the interval of the second lead frame portion 327 with respect to the arrangement direction of the control electrode 333 is different from the interval of the control electrode 333. Therefore, the bending angle θ of the second lead frame portion 327 with respect to the first lead frame portion 326 of each control lead frame 325 is not the same. However, by adjusting the width and/or the interval of the second lead frame portion 327, the bending angle θ of the second lead frame portion 327 with respect to the first lead frame portion 326 is made equal, in other words, the second lead frame portions 327 may be arranged in parallel to each other.

Metal plating suitable for bonding such as Ni plating or Au plating is applied to the surfaces of each of the control electrodes 332 and 333. The first lead frame portions 326 of each control lead frame 325 and the control electrode 332 are connected by the first bonding wire 324a. That is, one end of the first bonding wire 324a is bonded to the control electrode 332, and the other end of the first bonding wire 324a is bonded to the first lead frame portion 326. The joint portion between the other end of the first bonding wire 324a and the first lead frame portion 326 may be the bent portion 371.

In addition, the second lead frame portion 327 of each control lead frame 325 and the control electrode 333 are connected by a second bonding wire 324b.

The diameters and lengths of the first bonding wire 324a and the second bonding wire 324b are substantially the same.

In a circuit in which a plurality of signal transmission paths having portions connected by bonding wires in the paths are connected in parallel, if there is a difference in the impedances of each signal transmission path, a signal resonates between semiconductor devices, and it may cause a malfunction. Since the cross-sectional area of the bonding wire is smaller than the cross-sectional area of the lead frame, the proportion occupied by the impedance of the bonding wire to the whole impedance in the signal transmission path increases (usually 100 to 1000 times). Therefore, by making the diameter and the length of the bonding wire used for each signal transmission path the same, the impedance of the signal line of each semiconductor device is made approximately the same, resonance, oscillation, etc. of the semiconductor device are suppressed. Therefore, it is preferable that all the first bonding wires 324a and all the second bonding wires 324b have the same diameter and length.

As described above, the bending angles θ of the bent portions 371 of the three control lead frames 325 are different. Referring to FIG. 4, the bent portions 371 of the three control lead frames 325 in the direction opposite to the bending direction, in other words, on the outer peripheral side, are positioned closer to the first semiconductor device 328. If the lengths of the second lead frame portions 327 of the control lead frames 325 are substantially the same, the second lead frame portion 327 of the control lead frame 325 on the bending direction side, in other words, the inner peripheral side, is positioned such that its distal end positions farther from the control electrode 333 of the second semiconductor device 329. Therefore, the position of the other end of the second bonding wire 324b having the same length from the tip of the second lead frame portion 327 is different from the bonding portion to be bonded to the second lead frame portion 327. The bending angle θ of each control lead frame 325 and the length of the second lead frame portion 327 are set such that the other end of the second bonding wire 324b having substantially the same length as the first bonding wire 324a can be bonded to the second lead frame portions 327 of each control lead frame 325.

To bond the end portion of the first bonding wire 324a to the first lead frame portion 326 of the control lead frame 325, in a state in which the end portion of the first bonding wire 324a is pressurized to the first lead frame portion 326, radiofrequency vibration is applied to the end portion of the first bonding wire 324a in the extending direction, that is, in the longitudinal direction, of the first lead frame portion 326. Frictional heat is generated between the end portion of the first bonding wire 324a and the first lead frame portion 326 due to the vibration energy applied to the end portion of the first bonding wire 324a, such that the end portion of the first bonding wire 324a is bonded to the first lead frame portion 326. The control electrode 332 of the first semiconductor device 328 is disposed on an extended line in the longitudinal direction of the first lead frame portion 326. The rigidity in the longitudinal direction of the first lead frame portion 326 is larger than the rigidity in the direction intersecting the longitudinal rigidity. Therefore, sufficient vibration energy can be applied to the end portion of the first bonding wire 324a, and sufficient bonding strength can be obtained between the first bonding wire 324a and the first lead frame portion 326.

Similarly, to bond the end portion of the second bonding wire 324b to the second lead frame portion 327 of the control lead frame 325, in a state in which the end portion of the second bonding wire 324b is pressurized to the second lead frame portion 327, radio frequency vibration is applied to the end portion of the second bonding wire 324b in the extending direction, that is, in the longitudinal direction, of the second lead frame portion 327. Frictional heat is generated between the second bonding wire 324b and the second lead frame portion 327 due to the vibration energy applied to the second bonding wire 324b, such that the end portion of the second bonding wire 324b is bonded to the second lead frame portion 327.

The control electrode 333 of the second semiconductor device 329 is disposed on an extended line in the longitudinal direction of the second lead frame portion 327. The rigidity in the longitudinal direction of the second lead frame portion 327 is larger than the rigidity in the direction intersecting the longitudinal rigidity. Therefore, sufficient vibration energy can be applied to the end portion of the second bonding wire 324b, and sufficient bonding strength can be obtained between the second bonding wire 324b and the second lead frame portion 327.

Conventionally, the second lead frame portion 327 is bent substantially at right angle with respect to the first lead frame portion 326, and the control electrode 333 of the second semiconductor device 329 is disposed in a direction orthogonal to the longitudinal direction of the second lead frame portion 327. Therefore, the end portion of the second bonding wire 324b is vibrated in a direction orthogonal to the longitudinal direction of the second lead frame portion 327. The rigidity of the second lead frame portion 327 in the direction orthogonal to the longitudinal direction of the second lead frame portion 327, that is, the width direction is small, and the second lead frame portion 327 tends to vibrate together with the radio frequency vibration given at the time of bonding. For this reason, it is impossible to apply large vibration energy to the end portion of the second bonding wire 324b and the second lead frame portion 327 during bonding, and sufficient bonding strength cannot be obtained.

As illustrated in FIG. 2, a plurality of the control lead frames 325 is connected to the first and second semiconductor devices 330 and 331 of the second circuit body 300L constituting the lower arm connecting structure via the first and second bonding wires 324a and 324b. The second lead frame portion 327 of the control lead frame 325 connected to the second circuit body 300L is bent in a direction opposite the second lead frame portion 327 of the control lead frame 325 connected to the first circuit body 300U constituting the upper arm connection structure. That is, it is symmetrical with respect to the boundary line between the first circuit body 300U and the second circuit body 300L. However, also in the control lead frame 325 connected to the second circuit body 300L, the center line in the width direction of the first lead frame portion 326 passes through the center in the width direction of the corresponding control electrode 332. In addition, the center line in the width direction of each second lead frame portion 327 passes through the center in the width direction of the corresponding control electrode 333. Therefore, also in the lower arm connection structure, the same effect as the upper arm connection structure can be obtained.

According to an embodiment of the present invention, the following operational effects can be obtained.

(1) The power semiconductor module 300 is provided with the control lead frame 325 which is connected to the control electrode 332 of the first semiconductor device 328 via the first bonding wire 324a and is connected to the control electrode 333 of the second semiconductor device 329 via the second bonding wire 324b. The control lead frame 325 includes the first lead frame portion 326, the bent portion 371, and the second lead frame portion 327 connected to the first lead frame portion 326 via the bent portion 371. One end of the first bonding wire 324a is connected to the control electrode 332 of the first semiconductor device 328, and the other end of the first bonding wire 324a is connected to the first lead frame portion 326 or the bent portion 371. The center line in the width direction of the first lead frame portion 326 extends in a direction overlapping with the control electrode 332 of the first semiconductor device 328, and the center line in the width direction of the second lead frame portion 327 extends in the direction overlapping the control electrode 333 of the second semiconductor device 329. Therefore, when the first and second bonding wire portions 324a and 324b are bonded to the first and second lead frame portions 326 and 327, the vibration direction of the end portions of the first and second bonding wires 32a and 324b is a direction in which the rigidity of the first and second lead frame portions 326 and 327 is large. This makes it possible to apply large vibration energy at the time of bonding, and it is possible to increase the bonding strength.

(2) The angle of the bent portion 371 and the length of the second lead frame portion 327 are set such that the length of the first bonding wire 324a connecting the control electrode 332 of the first semiconductor device 328 and the first lead frame portion 326 or the bent portion 371 and the length of the second bonding wire 324b connecting the control electrode 333 of the second semiconductor device 329 and the second lead frame portion 327 can be made equal to each other. Therefore, it is possible to make the impedances of the first bonding wire 324a and the second bonding wire 324b equal to each other and to suppress resonance, oscillation, etc. between the first and second semiconductor devices 328 and 329 connected in parallel.

In the above embodiment, the center line in the width direction of each first lead frame portion 326 passes through the center in the width direction of the corresponding control electrode 332, and the center line in the width direction of each second lead frame portion 327 passes through the center in the width direction of the corresponding control electrode 333. However, even if the center line in the width direction of the first lead frame portion 326 does not coincide with the center in the width direction of the control electrode 332, it is sufficient if the extended line of the first lead frame portion 326 overlaps the control electrode 332. Similarly, even if the center line in the width direction of the second lead frame portion 327 does not coincide with the center in the width direction of the control electrode 333, it is sufficient if the extended line of the second lead frame portion 327 overlaps the control electrode 332.

Further, the first lead frame portion 326 only needs to extend in a direction overlapping with the first semiconductor device 328 from the bent portion 371 toward the side opposite to the first semiconductor device 328 side, and the first lead frame portion 326 does not necessarily extend in a direction overlapping with the control electrode 332 of the first semiconductor device 328. Similarly, the second lead frame portion 327 only needs to extend in a direction overlapping with the second semiconductor device 329 from the bent portion 371 toward the second semiconductor device 329 side, and the second lead frame portion 327 does not necessarily extend in a direction overlapping with the control electrode 332 of the first semiconductor device 328.

In each of the above embodiments, the power semiconductor module 300 is exemplified which includes a plurality of control lead frames 325 connected to a plurality of the control electrodes 332 and 333 of the first and second semiconductor devices 328 and 329. However, the present invention is also applicable to a case where only one control lead frame 325 is connected to the control electrodes 332 and 333 of the first and second semiconductor devices 328 and 329.

The power semiconductor module 300 having the above-described control lead frame 325 is exemplified merely as an example, and the present invention is not limited to these contents. Other embodiments considered within technical ideas of the present invention are also included within the scope of the present invention.

REFERENCE SIGNS LIST 300 power semiconductor module
324a first bonding wire
324b second bonding wire
325 control lead frame
326 first lead frame portion
327 second lead frame portion
328, 330 first semiconductor device
329, 331 second semiconductor device
332, 333 control electrode
371 bent portion
θ bending angle

The invention claimed is:

1. A power semiconductor module, comprising:
a first semiconductor device;
a second semiconductor device electrically connected in parallel to the first semiconductor device; and
a control lead frame connected to a control electrode of the first semiconductor device via a first bonding wire and connected to a control electrode of the second semiconductor device via a second bonding wire,
wherein the control lead frame includes a first lead frame portion, a bent portion, and a second lead frame portion connected to the first lead frame portion via the bent portion,
one end of the first bonding wire is connected to the control electrode of the first semiconductor device, the other end of the first bonding wire is connected to the first lead frame portion or the bent portion,
one end of the second bonding wire is connected to the control electrode of the second semiconductor device, the other end of the second bonding wire is connected to the second lead frame portion,
the first lead frame portion extends in a direction overlapping with the first semiconductor device from the bent portion toward a side opposite to the first semiconductor device side, and
the second lead frame portion extends in a direction overlapping with the second semiconductor device from the bent portion toward the second semiconductor device side.

2. The power semiconductor module according to claim 1, wherein the first lead frame portion extends in a direction overlapping with the control electrode of the first semiconductor device, and
the second lead frame portion extends in a direction overlapping with the control electrode of the second semiconductor device.

3. The power semiconductor module according to claim 2, comprising a plurality of the control lead frames,
wherein each of the first semiconductor device and the second semiconductor device has a plurality of the control electrodes connected to the control lead frames, and
the lengths of a plurality of first bonding wires connecting the first lead frame portion or the bent portion of each of the control lead frames to the control electrode of the first semiconductor device and the length of a plurality of the second bonding wires connecting the second lead frame portion of each of the control lead frames and the control electrode of the second semiconductor device are all the same.

4. The power semiconductor module according to claim 3, wherein the angle of the bent portion of each of the control lead frames and the length of the second lead frame portion are set so as to equalize the length of the first bonding wire connecting the control electrode and the first lead frame or the bent portion of the first semiconductor device and the length of the second bonding wire connecting the control electrode and the second lead frame of the second semiconductor device.

5. The power semiconductor module according to claim 4, wherein the angles of the bent portions of the control lead frames differ from each other such that the second lead frame portion extends in a direction overlapping with the control electrode of the second semiconductor device.

* * * * *